US012644921B2

(12) United States Patent
Huang et al.

(10) Patent No.: US 12,644,921 B2
(45) Date of Patent: Jun. 2, 2026

(54) TEST CIRCUIT AND METHOD FOR OPERATING THE SAME

(71) Applicant: TAIWAN SEMICONDUCTOR MANUFACTURING COMPANY LTD., Hsinchu (TW)

(72) Inventors: Chia-Wei Huang, Hsinchu City (TW); Wei-Jhih Wang, Hsinchu (TW); Cheng-Cheng Kuo, Hsinchu (TW); Yuan-Yao Chang, Kaohsiung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/655,363

(22) Filed: May 6, 2024

(65) Prior Publication Data

US 2024/0288489 A1     Aug. 29, 2024

Related U.S. Application Data

(63) Continuation of application No. 17/459,989, filed on Aug. 27, 2021, now Pat. No. 12,007,431.

(51) Int. Cl.
*G01R 31/28*     (2006.01)
*H01L 21/66*     (2006.01)
*H10P 74/00*     (2026.01)

(52) U.S. Cl.
CPC ........ *G01R 31/2831* (2013.01); *H10P 74/277* (2026.01)

(58) Field of Classification Search
CPC ........................ G01R 31/2831; G01R 31/2884
See application file for complete search history.

(56) References Cited

U.S. PATENT DOCUMENTS 6,975,978 B1 * 12/2005  Ishida ............ G01R 31/318342
                                                                716/108
2002/0047724 A1     4/2002  Marshall et al.
                                    (Continued)

FOREIGN PATENT DOCUMENTS

CN         101276804 A     10/2008
JP         2008140965 A  *  6/2008  ............. H01L 21/66

OTHER PUBLICATIONS

Espacenet English translation JP 2008140965 A (Year: 2008).*
                                    (Continued)

*Primary Examiner* — Eman A Alkafawi
*Assistant Examiner* — Courtney G Mcdonnough
(74) *Attorney, Agent, or Firm* — WPAT LAW; Anthony King

(57)                ABSTRACT
The present disclosure provides a wafer. The wafer includes a die, a scribe line adjacent to the die, and a test circuit adjacent to the scribe line. The test circuit includes a first switch configured to simultaneously couple a first DUT of a first set of DUTs arranged in a first column and a second DUT of a second set of DUTs arranged in a second column to a signal supply node. The test circuit includes a second switch configured to simultaneously couple the first DUT and the second DUT to a signal receive node. The second switch has a node directly coupled to the first DUT, the second DUT, and the first switch. There is no switch connected between the first DUT and the second DUT.

20 Claims, 6 Drawing Sheets

(56)     References Cited

U.S. PATENT DOCUMENTS

| | | | |
|---|---|---|---|
| 2007/0241766 A1* | 10/2007 | Kamitai ............. | G01R 31/2884 324/762.05 |
| 2016/0047853 A1* | 2/2016 | Oh ..................... | G01R 31/2601 324/762.01 |
| 2017/0125309 A1 | 5/2017 | Lee et al. | |

OTHER PUBLICATIONS

U.S. Pat. No. 7,782,073B2 is the US counterpart application of CN101276804A.
Office Action, Cited Reference and Search Report dated Oct. 14, 2025 issued by the China National Intellectual Property Administration for corresponding China patent application No. 202210217656.3 (provided with brief translation of the Search report).

* cited by examiner

| | |
|---|---|
| providing a wafer having a die and a scribe line adjacent to the die | ~51 |
| providing a first switch | ~52 |
| providing a second switch | ~53 |
| providing a third switch | ~54 |

TEST CIRCUIT AND METHOD FOR OPERATING THE SAME

CROSS-REFERENCE TO RELATED APPLICATION

This application is a continuation of prior-filed U.S. application Ser. No. 17/459,989, filed Aug. 27, 2021, the contents of which are incorporated herein by reference in its entirety.

BACKGROUND

Minimization of variability in electrical components such as transistors, and reducing cross-wafer disparity have always been concerns in integrated circuit manufacture and design.

A process control monitor (PCM) test line is a typical wafer-level testing structure, which places devices-under-test (DUTs) and periphery test circuits in a wafer scribe line. The space in the wafer scribe line depends on several factors and the number of DUTs may be limited thereby.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1:
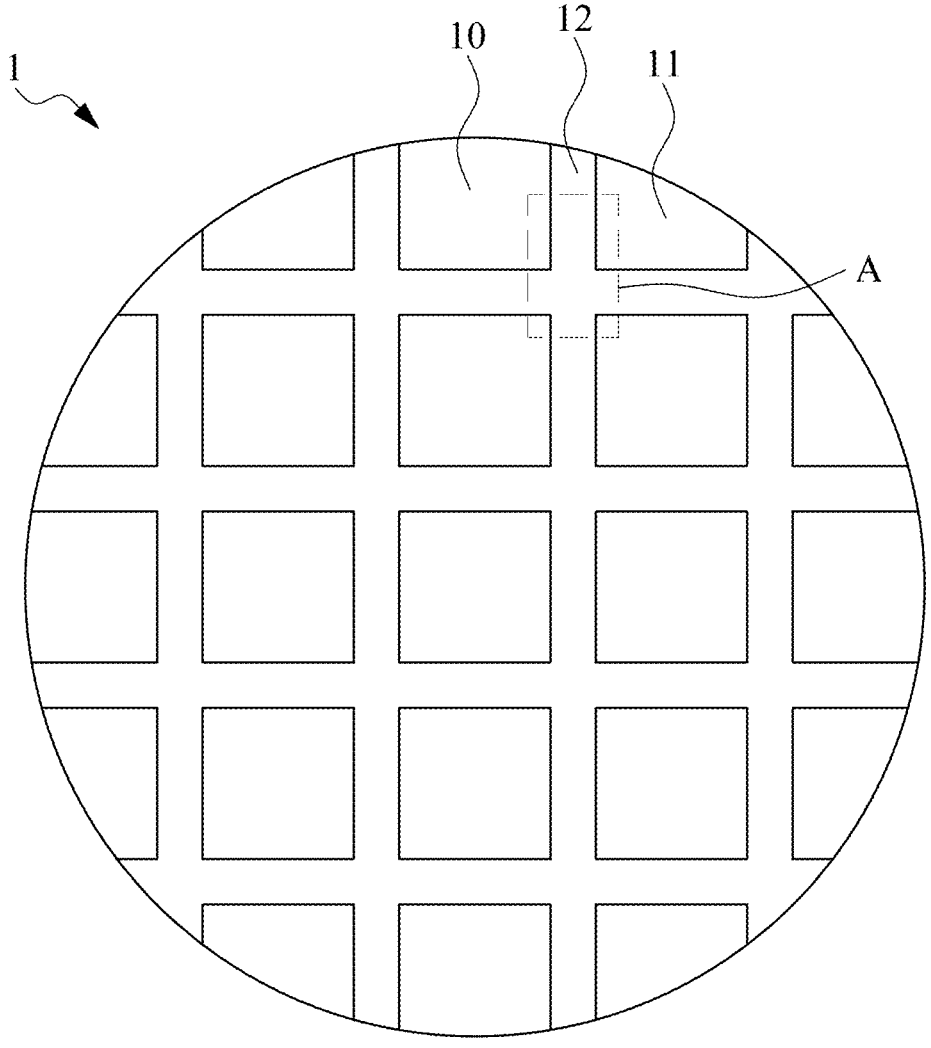
FIG. 1 is a top view of an example semiconductor wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following descriptions should be understood to represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a top view of an example semiconductor wafer 1. The semiconductor wafer 1 may include a plurality of dies or chips (such as dies or chips 10 and 11) arranged in a grid pattern and separated by vertical scribe lines 12 and horizontal scribe lines 12'.

Individual dies 10 and 11 within the semiconductor wafer 1 may contain circuitry. The dies 10 and 11 may be separated by a sawing operation performed through the scribe lines (e.g., the vertical scribe lines 12) and then packaged to form separated devices. The dies 10 and 11 on the semiconductor wafer 1 may include several basic electrical components, which may be interconnected to form semiconductor devices (e.g., an integrated circuit (IC)) to form logic or other functions. In some examples, the basic electrical components may include active devices such as transistors and passive devices such as resistors, capacitors, inductors, or a combination thereof.

In an exemplary semiconductor fabrication process, each basic electrical component may need to be tested and evaluated at selected steps, or at the end, of the formation so as to maintain and assure the device quality. However, an individual basic electrical component may not be readily testable once integrated into a circuit. In order to verify that each basic electrical component has been fabricated according to design specification and exhibits selected properties or values, one applicable quality control methodology fabricates copies or replicates of the basic electrical components along with the actual basic electrical components. The copies of the basic electrical components may be formed in a scribe line, a street, or other locations not occupied by the actual components on the wafer 1. Each copy may be coupled to a signal source or a measurement device (such as a source measurement unit (SMU)) through one or more test pads exposed through the top surface of wafer.

Such copies may have properties or values similar to or the same as their counterparts since they are fabricated using the same operations. As such, the electrical characteristics (such as but not limited to a, test result, response to signal, performance parameter, etc.) of the copies can be applied to the non-tested basic electrical components.

The copies of the basic electrical components may be referred to as devices-under-test (DUTs) throughout the present disclosure. The areas containing the copies of the basic electrical components may be referred to as a process control monitor (PCM) test line or abbreviated as a test line throughout the present disclosure.

In some examples, one or more of the test lines may be formed in the scribe lines 12. In alternative examples, one or more of the test lines may be formed inside the dies 10 and 11. In some examples, the test line may be used to monitor the quality of wafer processing in manufacturing, for example, to observe the device variation on the semiconductor wafer 1.

Figure 2:
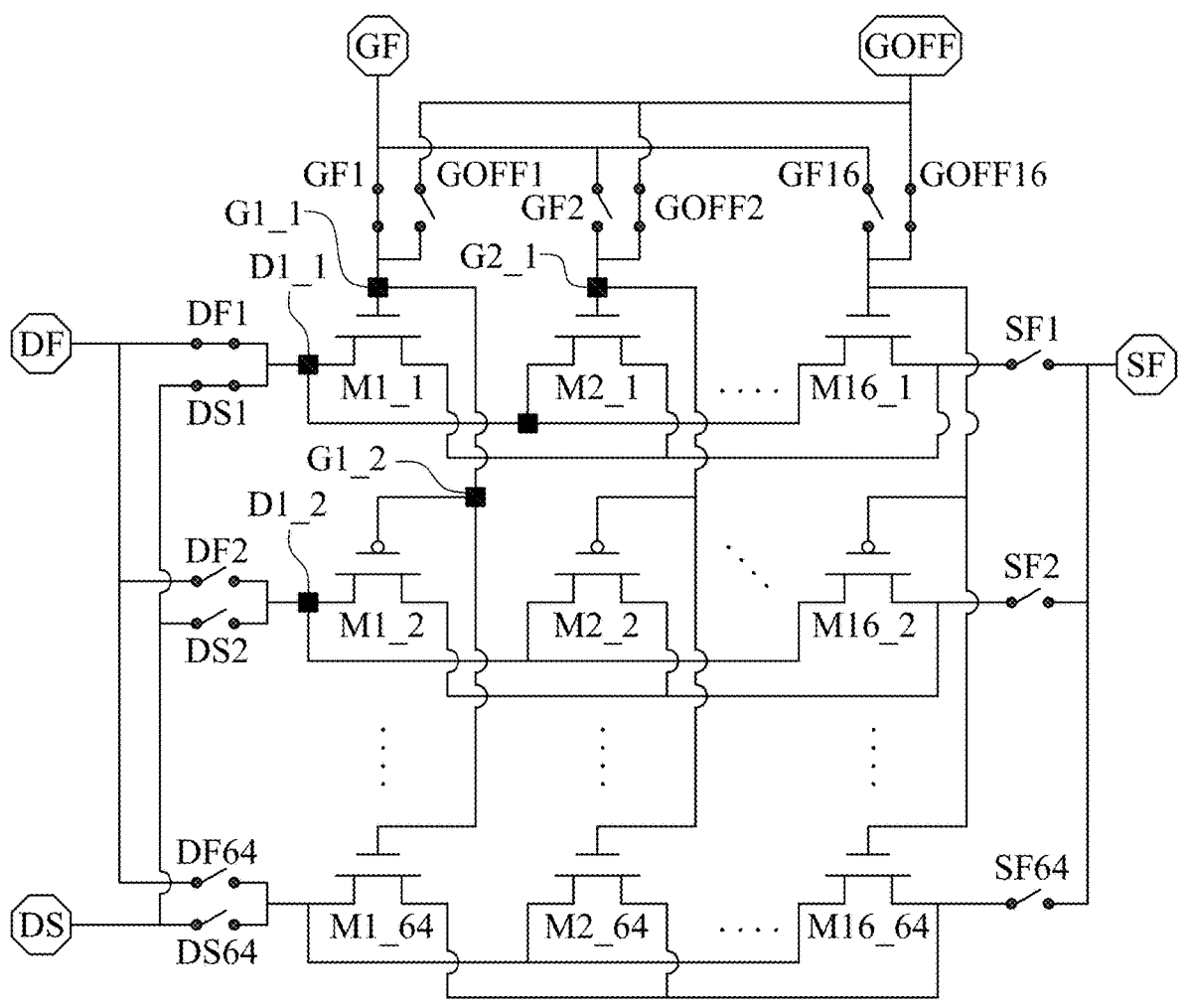
FIG. 2 shows an architecture of an example test circuit in accordance with some embodiments of the present disclosure.

FIG. 2 shows the architecture of an example test circuit in accordance with some embodiments of the present disclosure. In some examples, the test circuit in FIG. 2 may be a schematic block diagram of a portion of the semiconductor wafer 1 denoted by dashed box A as shown in FIG. 1. For example, the test circuit in FIG. 2 may be located in a vertical scribe line 12 or a horizontal scribe line 12' of the semiconductor wafer 1.

The test circuit in FIG. 2 includes 1024 DUTs M1_1, M2_1 . . . , M16_1, M1_2, M2_2, . . . , M16_2, . . . , M1_64, M2_64, . . . , M16_64 arranged in an array of 64 rows and 16 columns and periphery test circuits (such as but not limited to a, pad, decoder, latch, switch, signal source, measurement device, etc.)

In some embodiments, each of the DUTs may include a MOS transistor, such as a NMOS transistor or a PMOS transistor. For example, the DUT M1_1 may include a NMOS transistor having a bulk (or a substrate), a drain D, a source S, and a gate G. However, one skilled in the art will realize that, for different DUTs, more or fewer pairs of test pads may be needed. For example, for probing a resistor, only two pairs of test pads are needed. Therefore, the test circuit design provided in the present disclosure may be modified to adapt to other types of devices, such as a diode, or a resistor, as long as the number of the device nodes or terminals is less than or equal to the testing pads.

As can be seen from FIG. 2, the DUTs are placed in an integral area surrounded by the periphery test circuits. For example, the DUTs are placed together without interruption from the periphery test circuits. In some embodiments, the areas occupied by the DUTs may be considered as a central or a core region surrounded by the periphery test circuits.

The DUTs M1_1, M2_1 . . . , M16_1 are in the same group or in the same row. The DUTs M1_1, M1_2, . . . , and M1_64 are in the same group or in the same column.

In some embodiments, the DUTs having similar electrical characteristics in response to a signal (such as a voltage or a current forced or set to the DUTs) are arranged in the same rows.

For example, NMOS transistors can be arranged in the first rows and PMOS transistors can be arranged in the second rows. In some alternative embodiments, PMOS transistors may be arranged in the first rows and NMOS transistors may be arranged in the second rows. In other words, DUTs in the same rows may have similar electrical characteristics in response to a signal.

In some embodiments, DUTs in the same rows may have the same threshold voltage ($V_{TH}$). In some embodiments, DUTs in the same rows may have the same aspect ratio (e.g., a ratio of width to length).

In some embodiments, DUTs in the different (or adjacent) rows may have different electrical characteristics in response to a signal, depending on different design specifications. In some embodiments, DUTs in the different (or adjacent) rows may have different threshold voltage ($V_{TH}$), depending on different design specifications. In some embodiments, DUTs in the different (or adjacent) rows may have different aspect ratios (e.g., a ratio of width to length), depending on different design specifications.

Each drain D of the DUTs placed in the same rows (such as the DUTs M1_1, M2_1 . . . , M16_1) is coupled or connected to the same pair of switches for controlling signals forced or set to the drain D. Each source S of the DUTs placed in the same rows (such as the DUTs M1_1, M2_1 . . . , M16_1) is coupled or connected to the same switch for controlling signals forced or set to the source S. Each gate G of the DUTs placed in the same columns (such as the DUTs M1_1, M1_2 . . . , M1_64) is coupled or connected to the same pair of switches for controlling signals forced or set to the gate G.

For example, the drain D of the DUT M1_1 is coupled or connected to a pair of switches DF1 and DS1 through a contact pad D1_1. The switch DF1 selectively couples the drain D of the DUT M1_1 to a signal supply node (or a forcing node) DF, and the switch DS1 selectively couples the drain D of the DUT M1_1 to a signal receive node (or a sensing node) DS.

The source S of the DUT M1_1 is coupled or connected to a switch SF1, which selectively couples the source S of the DUT M1_1 to a signal supply node SF.

The gate G of the DUT M1_1 is coupled or connected to a pair of switches GF1 and GOFF1 through a contact pad G1_1. The switch GF1 selectively couples the gate G of the DUT M1_1 to a signal supply node GF. The switch GOFF1 selectively couples the gate G of the DUT M1_1 to a signal supply node GOFF.

The drain D of the DUT M2_1 is coupled or connected to the pair of switches DF1 and DS1 through a contact pad D2_1. The switch DF1 selectively couples the drain D of the DUT M2_1 to the signal supply node DF, and the switch DS1 selectively couples the drain D of the DUT M2_1 to the signal receive node DS.

The source S of the DUT M2_1 is coupled or connected to the switch SF1, which selectively couples the source S of the DUT M2_1 to the signal supply node SF.

The gate G of the DUT M2_1 is coupled or connected to a pair of switches GF2 and GOFF2 through a contact pad G2_1. The switch GF2 selectively couples the gate G of the DUT M2_1 to the signal supply node GF. The switch GOFF2 selectively couples the gate G of the DUT M2_1 to the signal supply node GOFF.

The drain D of the DUT M1_2 is coupled or connected to a pair of switches DF2 and DS2 through a contact pad D1_2. The switch DF2 selectively couples the drain D of the DUT M1_2 to the signal supply node DF, and the switch DS2 selectively couples the drain D of the DUT M1_2 to the signal receive node DS.

The source S of the DUT M1_2 is coupled or connected to a switch SF2, which selectively couples the source S of the DUT M1_2 to the signal supply node SF.

The gate G of the DUT M1_2 is coupled or connected to the pair of switches GF1 and GOFF1 through a contact pad G1_2. The switch GF1 selectively couples the gate G of the DUT M1_2 to the signal supply node GF. The switch GOFF1 selectively couples the gate G of the DUT M1_2 to the signal supply node GOFF.

The switch GF1 and the switch GF2 may be connected to a common node. The switch GOFF1 and the switch GOFF2 may be connected to a common node. The contact pad G1_1 and the contact pad G2_1 may be connected to a common node. The contact pad G1_1 and the contact pad G1_2 may be connected to a common node.

The switch DF1 and the switch DF2 may be connected to a common node. The switch DS1 and the switch DS2 may be connected to a common node. The contact pad D1_1 and the contact pad D2_1 may be connected to a common node. The contact pad D1_1 and the contact pad D1_2 may be connected to a common node.

During a test line measurement, the signal supply nodes GF, DF, and SF may be coupled or connected to a terminal or end of a signal source for forcing a signal (such as a voltage and/or a current) to the DUTs. The signal receive node DS may be coupled or connected to a terminal or end of a measurement device (not shown in the figures) for sensing a signal (such as a voltage and/or a current) from the DUTs. In some embodiments, the signal supply nodes GF, DF, and SF and the signal receive node DS may be coupled or connected to the same SMU. In some embodiments, the signal supply nodes GF, DF, and SF and the signal receive node DS may be coupled or connected to separate devices. For example, the signal supply nodes GF, DF, and SF may be coupled or connected to a voltage source. The signal receive node DS may be coupled or connected to a current measurement device (e.g., a sense amplifier).

In the same horizontal drain row, the drains D of the DUTs (such as the DUT M1_1, the DUT M2_1, . . . , and the DUT M16_1) are connected to a common node. For example, the drain D of the DUT M1_1, the drain D of the DUT M2_1, and the drain D of the DUT M16_1 are connected to a common node.

In the same horizontal drain row, the drains D of the DUTs (such as the DUT M1_1, the DUT M2_1, . . . , and the DUT M16_1) are interconnected and coupled to the same pair of switches (such as the pair of switches DF1 and DS1).

For example, the drain D of the DUT M1_1 and the drain D of the DUT M2_1 can be connected through the contact pads (or testing pads) and wires (or other interconnection elements, such as conductive lines and/or vias) without active devices (such as transistors or switches) formed therebetween. In some embodiments, no passive devices (such as resistors, capacitors, and/or inductors) are intentionally formed between the drain D of the DUT M1_1 and the drain D of the DUT M2_1.

In the same horizontal source row, the sources S of the DUTs (such as the DUT M1_1, the DUT M2_1, . . . , and the DUT M16_1) are connected to a common node. For example, the source S of the DUT M1_1, the source S of the DUT M2_1, and the source S of the DUT M16_1 are connected to a common node.

In the same horizontal source row, the sources S of the DUTs (such as the DUT M1_1, the DUT M2_1, . . . , and the DUT M16_1) are interconnected and coupled to the same pair of switches (such as the switch SF1).

For example, the source S of the DUT M1_1 and the source S of the DUT M2_1 can be connected through the contact pads (or testing pads) and wires (or other interconnection elements, such as conductive lines and/or vias) without active devices (such as transistors or switches) formed therebetween. In some embodiments, no passive devices (such as resistors, capacitors, and/or inductors) are intentionally formed between the source S of the DUT M1_1 and the source S of the DUT M2_1.

In the same vertical gate row, the gates G of the DUTs (such as the DUT M1_1, the DUT M1_2, . . . , and the DUT M1_64) are connected to a common node. For example, the gate G of the DUT M1_1, the gate G of the DUT M1_2, and the gate G of the DUT M1_64 are connected to a common node.

In the same vertical gate row, the gates G of the DUTs (such as the DUT M1_1, the DUT M1_2, . . . , and the DUT M1_64) are interconnected and coupled to the same pair of switches (such as the pair of switches GF1 and GOFF1).

For example, the gate G of the DUT M1_1 and the gate G of the DUT M1_2 can be connected through the contact pads (or testing pads) and wires (or other interconnection elements, such as conductive lines and/or vias) without active devices (such as transistors or switches) formed therebetween. In some embodiments, no passive devices (such as resistors, capacitors, and/or inductors) are intentionally formed between the gate G of the DUT M1_1 and the gate G of the DUT M1_2.

Switches for the signal supply nodes DF, SF, GF, and GOFF are shared among the test units. For example, the test unit for testing the DUT M1_1 and the test unit for testing the DUT M2_1 share the same switch DF1. For example, the test unit for testing the DUT M1_1 and the test unit for testing the DUT M1_2 share the same switch GF1. Similarly, switches for the signal receive node DS are shared among the test units. For example, the test unit for testing the DUT M1_1 and the test unit for testing the DUT M2_1 share the same switch DS1.

The DUTs in the same row (such as the DUT M1_1 and the DUT M2_1) can by selected and evaluated through the same switch (such as the pair of switches DF1 and DS1). Similarly, the DUTs in the same column (such as the DUT M1_1 and the DUT M1_2) can by selected and evaluated through the same switch (such as the pair of switches GF1 and GOFF1).

In some embodiments, while measuring the DUT M1_1, the DUT M1_1 may be turned on, and the other DUTs may be turned off. For example, while measuring the DUT M1_1, the gate column controlled by the switch GF1 may be turned on and the other gate columns may be turned off. Based on circuit parameters to be measured, the switch DF1 (or the switch SF1) may be turned on and the other drain rows (or source rows) may be turned off.

In some embodiments, the other gate columns may be coupled to the signal supply node GOFF through the switches (including, for example, the switches GOFF2 and GOFF16). In some embodiments, the signal supply node GOFF and the signal supply node GF may be biased reversely. For example, the signal supply node GOFF may be biased as 0V or a small negative voltage to turn off the other gate columns.

In some embodiments, the switches of the present disclosure may include switching circuitry. In some embodiments, the switches of the present disclosure may include one or more pass transistors that are controlled by one or more decoders to selectively connect a selected conductive path between DUTs and the nodes. Specifically, the switch DF1 may include a pass transistor (not shown in the figures) connected between the drain D of the DUT M1_1 and the pad coupled to the signal supply node DF. The pass transistor may include a gate that is controlled by a decoder (not shown in the figures).

In some embodiments, the decoders may provide control signals that connect a selected conductive path during a test line measurement. Specifically, a decoder circuit may receive address information from a control system (not shown in the figures), and generates control signals that turns on (or turns off) one of pass transistors associated with the selected conductive path, thereby connecting the selected conductive path to the nodes.

In some embodiments, the test circuit in FIG. 2 may be formed in a scribe line on a wafer. However, the recitations of the embodiments of the present disclosure may be applied to other aspects, and may be used in the probing of circuits inside semiconductor chips (as compared to in the scribe lines).

By making good use of the switching function of the DUTs and sharing switches among the DUTs, only one bit of I/O decoding switch is needed for controlling all DUTs placed in a bit-line.

The required number of the switches in between the DUTs is reduced, and more spaces are available for placing the DUTs.

This large number of DUTs or samples enables detection of defects on a parts-per-million (PPM) scale. In addition, the ability to distinguish systematic variation from random variation is increased and, when desirable, more arrays may be placed close to each other in the test circuit. The test circuit provided in the present disclosure is capable of measuring and evaluating DUTs accurately and efficiently, and can help minimize variability among electrical components and decrease conflicts from cross-wafer disparity.

Figure 3:
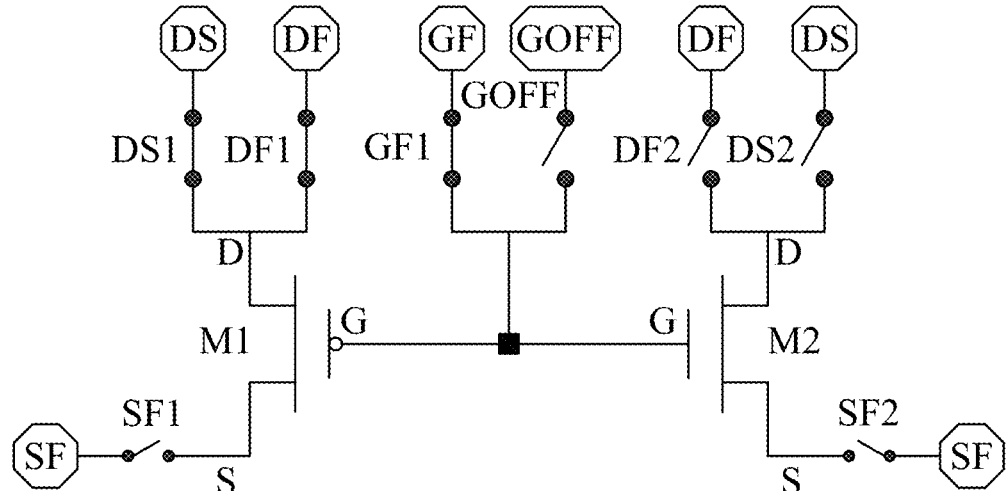
FIG. 3 shows an architecture of an example test circuit in accordance with some embodiments of the present disclosure.

FIG. 3 shows the architecture of an example test circuit in accordance with some embodiments of the present disclosure.

The test circuit in FIG. 3 includes 2 DUTs M1 and M2. In some embodiments, each of the DUTs may include a MOS transistor, such as a NMOS transistor or a PMOS transistor. In some embodiments, the DUTs in the test circuit in FIG. 3 may have different electrical characteristics in response to a signal (such as a voltage or a current forced or set to the DUTs). For example, the DUT M1 may be a PMOS transistor and the DUT M2 may be a NMOS transistor.

The drain D of the DUT M1 is coupled or connected to a pair of switches DF1 and DS1. The switch DF1 selectively couples the drain D of the DUT M1 to a signal supply node DF, and the switch DS1 selectively couples the drain D of the DUT M1 to a signal receive node DS.

The source S of the DUT M1 is coupled or connected to a switch SF1, which selectively couples the source S of the DUT M1 to a signal supply node SF.

The gate G of the DUT M1 is coupled or connected to a pair of switches GF1 and GOFF1. The switch GF1 selectively couples the gate G of the DUT M1 to a signal supply node GF. The switch GOFF1 selectively couples the gate G of the DUT M1 to a signal supply node GOFF.

The drain D of the DUT M2 is coupled or connected to a pair of switches DF2 and DS2. The switch DF2 selectively couples the drain D of the DUT M2 to a signal supply node DF, and the switch DS2 selectively couples the drain D of the DUT M2 to a signal receive node DS.

The source S of the DUT M2 is coupled or connected to a switch SF2, which selectively couples the source S of the DUT M2 to a signal supply node SF.

The gate G of the DUT M2 is coupled or connected to the pair of switches GF1 and GOFF1. The switch GF1 selectively couples the gate G of the DUT M2 to the signal supply node GF. The switch GOFF1 selectively couples the gate G of the DUT M2 to the signal supply node GOFF.

Figure 4:
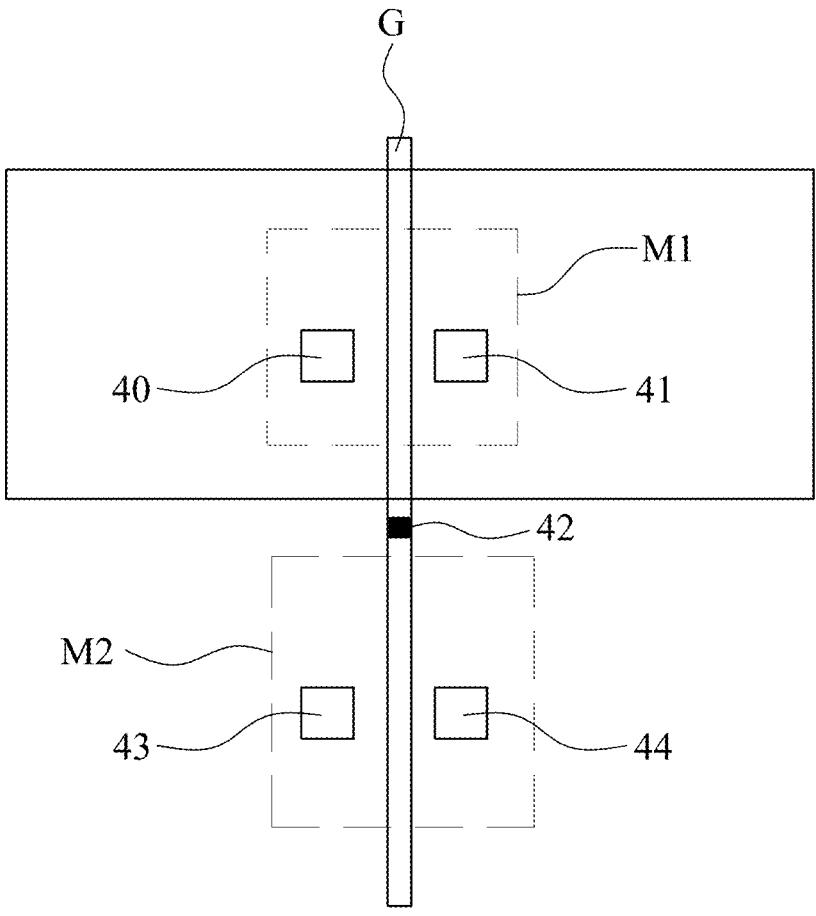
FIG. 4 shows a layout of the example test circuit as shown in FIG. 3 in accordance with some embodiments of the present disclosure.

The gate G of the DUT M1 and the gate G of the DUT M2 are interconnected and coupled to the same pair of switches GF1 and GOFF1. For example, as shown in FIG. 4, which shows a layout of the example test circuit as shown in FIG. 3, the DUT M1 and the DUT M2 share the gate structure G. The drain of the DUT M1 may be connected to the switch DF1 through a contact 40. The source of the DUT M1 may be connected to the switch SF1 through a contact 41. The gate structure G may be connected to the switch GF1 through a contact 42. The drain of the DUT M2 may be connected to the switch DF2 through a contact 43. The source of the DUT M2 may be connected to the switch SF2 through a contact 44.

For example, the gate G of the DUT M1 and the gate G of the DUT M2 can be connected through the contact 42 (or testing pad) and wires (or other interconnection elements, such as conductive lines and/or vias) without active devices (such as transistors or switches) formed therebetween. In some embodiments, no passive devices (such as resistors, capacitors, and/or inductors) are intentionally formed between the gate G of the DUT M1 and the gate G of the DUT M2. For example, the gate G of the DUT M1 and the gate G of the DUT M2 can be connected to a common node (such as the contact 42).

In some embodiments, the test circuit in FIG. 3 may include more DUTs based on the circuit parameters to be measured or the design requirements.

In some embodiments, the test circuit in FIG. 3 may be formed in a scribe line on a wafer. However, the recitations of the embodiments of the present disclosure may be applied to other aspects, and may be used in the probing of circuits inside semiconductor chips (as compared to in the scribe lines).

In some embodiments, the test circuit in FIG. 3 and the test circuit in FIG. 2 may be combined into an integral test circuit. In some embodiments, the test circuit in FIG. 3 and the test circuit in FIG. 2 may be applied in different blocks of a PCM test line.

In some embodiments, by interconnecting the gate G of the DUT M1 and the gate G of the DUT M2, cross relation of electrical characteristics in response to a signal for both NMOS transistor and PMOS transistor can be monitored, measured or evaluated.

For example, in the case of an NMOS transistor, the threshold voltage corresponds to the minimum voltage at a gate terminal of the transistor that allows current to flow from a source terminal to a drain terminal, i.e., the voltage at which the NMOS transistor turns on. For a PMOS transistor, the threshold voltage corresponds to the maximum gate voltage at which the transistor is turned on.

Figure 5:
FIG. 5 is a block diagram of an example method for manufacturing a test circuit in accordance with some embodiments of the present disclosure.
Figure 5:
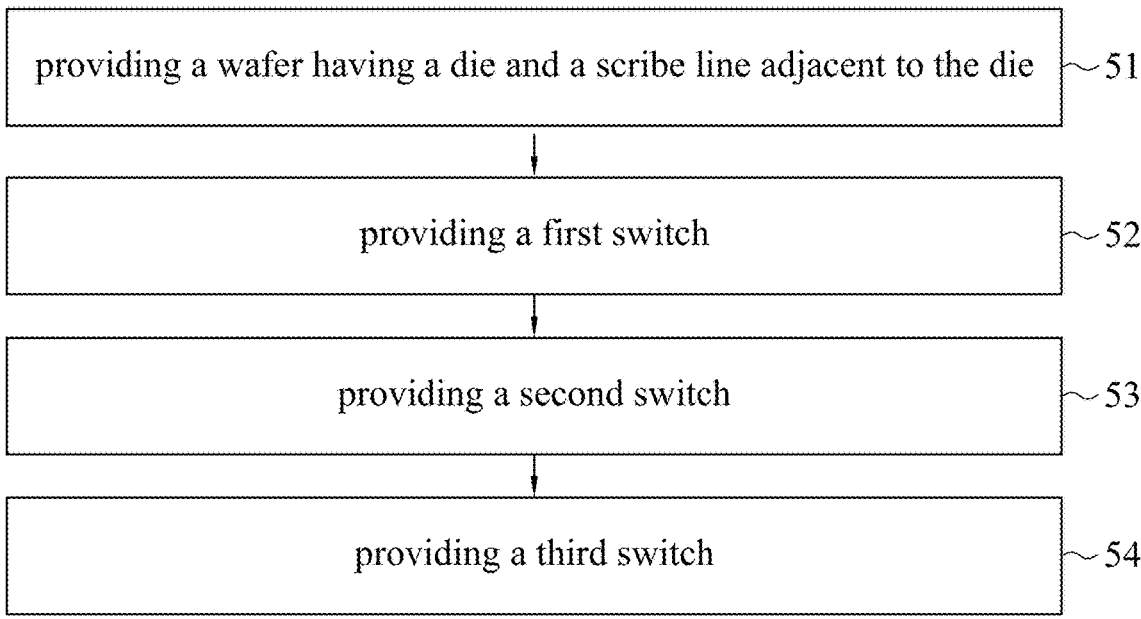

FIG. 5 is a block diagram of an example method 50 for manufacturing a test circuit in accordance with some embodiments of the present disclosure. In some embodiments, the method 50 may be a method for manufacturing the test circuit in FIG. 2.

Referring to operation 51, the method 50 includes providing a wafer, such as the semiconductor wafer 1 of FIG. 1. For example, the wafer may include dies separated by scribe lines.

Referring to operation 52, the method 50 includes providing a switch (which may be referred to as a first switch). In some embodiments, the switch may be configured to selectively couple a DUT to a signal supply node. For example, the switch GF1 in FIG. 2 may have a node coupled to the contact pad G1_1 and another node coupled to the signal supply node GF. The switch GF1 may be configured to selectively couple the DUT M1_1 to the signal supply node GF.

Referring to operation 53, the method 50 includes providing a switch (which may be referred to as a second switch). In some embodiments, the switch may be configured to selectively couple a DUT to a signal supply node. For example, the switch GF2 in FIG. 2 may have a node coupled to the contact pad G2_1 and another node coupled to the signal supply node GF. The switch GF2 may be configured to selectively couple the DUT M2_1 to the signal supply node GF.

Referring to operation 54, the method 50 includes providing a switch (which may be referred to as a third switch). In some embodiments, the switch may be configured to selectively couple a DUT to a signal supply node. For example, the switch DF1 in FIG. 2 may have a node coupled to the contact pad D1_2 and another node coupled to the signal supply node DF. The switch DF1 may be configured to selectively couple the DUT M1_1 and the DUT M1_2 to the signal supply node DF.

In some embodiments, the operation 52, the operation 53, and the operation 54 may be conducted in any other sequence.

Figure 6:
FIG. 6 is a block diagram of an example method for wafer testing in accordance with some embodiments of the present disclosure.
Figure 6:
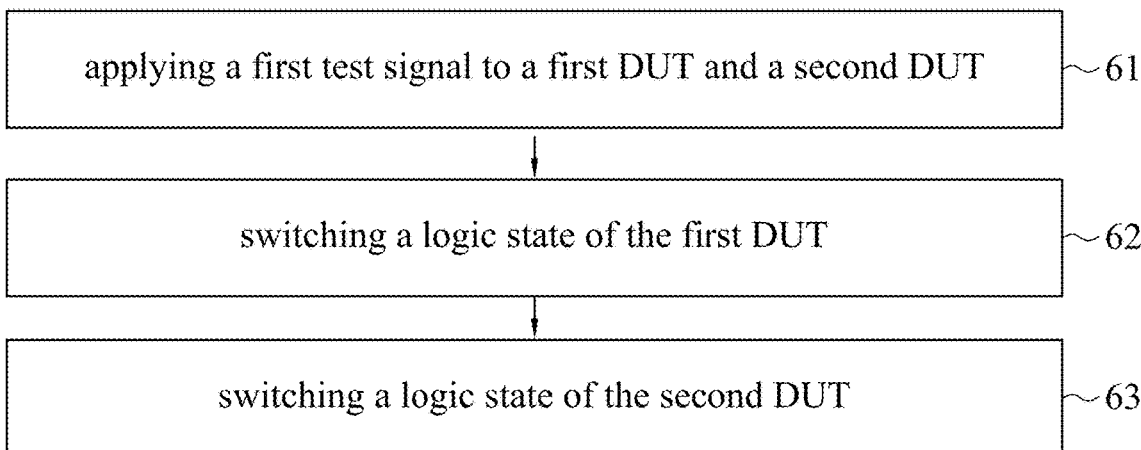

FIG. 6 is a block diagram of an example method 60 for wafer testing in accordance with some embodiments of the present disclosure. In some embodiments, the method 60 may be a method for wafer testing carried out by the test circuit in FIG. 2.

Referring to operation 61, the method 60 includes applying a test signal (such as a voltage and/or a current) DUTs in the same row (such as the DUT M1_1 and the DUT M2_1 in FIG. 2) or receiving a test signal from the DUTs through the same switch (such as the switch DF1 and/or the switch DS1).

In the illustrated example in FIG. 2, the switch DF1 is turned on to apply a signal to the DUT M1_1 and the switch DS1 is turned on to receive a signal from the DUT M1_1. The other drain rows may be turned off through the switches (including, for example, the switches DF2, DS2, DF64, DS64).

The signal (such as a voltage and/or a current) at the drain D of the DUT M1_1 may be set to different values to enable measurement of different circuit parameters. For example, the voltage at the drain D of the DUT M1_1 may be set to a power supply voltage Vdd. Alternatively, the voltage at the drain D of the DUT M1_1 may be set to a substantially small voltage close to, but above, ground level, such as less than or equal to about 0.1V (e.g., 0.05 V), to drive the drain terminal.

Similarly, the signal (such as a voltage and/or a current) at the source S of the DUT M1_1 may be set to different values to enable measurement of different circuit parameters. For example, the source S of the DUT M1_1 may be set to a substantially small voltage close to, but above, ground level, such as less than or equal to about 0.1V (e.g., 0.05 V), to drive the source terminal. For example, in operation, if a gate-source voltage (i.e., $V_{GS}$) applied across the gate and the source of the DUT M1_1 equals or exceeds a threshold voltage ($V_{TH}$) of the DUT M1_1, the DUT M1_1 can be turned on to conduct a current to be sensed at the signal receive node DS. If the gate-source voltage (i.e., $V_{GS}$) applied across the gate and the source of another one DUT is less than the threshold voltage ($V_{TH}$), the another one DUT would be turned off.

Referring to operation 62, the method 60 includes switching a logic state of a DUT.

For example, the DUT M1_1 may be turned on and the other DUTs in the same row may be turned off. In some embodiments, a short circuit may be detected via determining electrical continuity between the contact pad D1_1 and a contact pad (not annotated in FIG. 2) connected to the source of the DUT M1_1.

Referring to operation 63, the method 60 includes switching a logic state of a DUT.

For example, the DUT M2_1 may be turned on and the other DUTs in the same row may be turned off. A short circuit may be detected via determining electrical continuity between the contact pad D1_1 and the contact pad D2_1.

For example, the DUT M1_1 and the DUT M2_1 may be turned on and the other DUTs in the same row may be turned off. A short circuit may be detected via determining electrical continuity between the contact pad D1_1 and a contact pad (not annotated in the figures) connected to the drain of the DUT M3_1 (that is, the DUT next to the DUT M2_1).

In some embodiments, a signal (such as a positive voltage or a negative voltage) may be applied to the DUTs in the same column (such as the DUT M1_1 and the DUT M1_2) through the same switch (such as the switch GF1). For example, the PMOS of the DUTs in the same column may be turned on and the NMOS of the DUTs in the same column may be tuned off all at once. A signal (such as a voltage and/or a current) may be applied to each of the DUTs in the same column to analyze the response signal.

Some embodiments of the present disclosure provide a wafer. The wafer includes a die, a scribe line adjacent to the die, and a test circuit adjacent to the scribe line. The test circuit includes a first switch, a second switch, and a third switch. The first switch has a first node coupled to a first device-under-test and a second node coupled to a first signal supply node. The second switch has a first node coupled to the second DUT and a second node coupled to the first signal supply node. The third switch has a first node directly coupled to the first DUT and the second DUT. The third switch has a second node coupled to a second signal supply node. The third switch selectively couples both of the first DUT and the second DUT to the second signal supply node.

Some embodiments of the present disclosure provide a method for manufacturing a test circuit. The method includes providing a wafer having a die and a scribe line adjacent to the die and providing a first switch having a first node coupled to a first contact pad in the scribe line and a second node coupled to a first signal supply node. The method also includes providing a second switch having a first node coupled to a second contact pad in the scribe line and a second node coupled to the first signal supply node and providing a third switch having a first node directly coupled to a third contact pad and a fourth contact pad in the scribe line.

Some embodiments of the present disclosure provide a method for testing a wafer. The wafer includes a die, a scribe line adjacent to the die, and a test circuit in the scribe line. The test circuit includes a first switch coupled to a first contact pad, a second switch coupled to a second contact pad, and a third switch coupled to a third contact pad and a fourth contact pad. The method includes applying a first test signal to or receiving a first test signal from a first DUT and a second DUT through the third switch. The method also includes switching a logic state of the first DUT through the first switch and switching a logic state of the second DUT through the second switch.

The structures and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A wafer, comprising:
a die;
a scribe line adjacent to the die; and
a test circuit adjacent to the scribe line, the test circuit including:
    a first switch configured to simultaneously couple a first DUT of a first set of DUTs arranged in a first column and a second DUT of a second set of DUTs arranged in a second column to a signal supply node;
    a second switch configured to simultaneously couple the first DUT and the second DUT to a signal receive node; and
    a contact pad connecting with a node of the first switch and a node of the second switch, wherein the first DUT and the second DUT are connected to the first switch and the second switch through the contact pad,
    wherein there is no switch or DUT connected between a drain of the first DUT and a drain of the second DUT, and
    wherein there is no switch or DUT connected between any two of the node of the first switch, the node of the second switch, the contact pad, and the drain of the first DUT.

2. The wafer of claim 1, wherein the contact pad is disposed between the node of the first switch and the first DUT, and the contact pad is closer to the first DUT than to the second DUT.

3. The wafer of claim 1, wherein the first DUT and the second DUT share a same gate structure.

4. The wafer of claim 1, wherein the test circuit further includes a third switch coupled to gates of the first set of DUTs and configured to turn on or turn off the first set of DUTs.

5. The wafer of claim 4, wherein the test circuit further includes a fourth switch coupled to gates of the second set of DUTs and configured to turn on or turn off the second set of DUTs.

6. The wafer of claim 5, wherein the first DUT and a third DUT of the first set of DUTs have different electrical characteristic in response to a signal from the signal supply node, such that when the first DUT is turned on, the third DUT is turned off, or vice versa.

7. The wafer of claim 1, wherein the first DUT and the second DUT are arranged in a row.

8. The wafer of claim 1, wherein the test circuit is located in the scribe line.

9. The wafer of claim 5, wherein the first DUT comprises a metal oxide semiconductor (MOS) transistor having a gate coupled to the third switch and a drain coupled to the first switch.

10. The wafer of claim 9, wherein the second DUT comprises a MOS transistor having a gate coupled to the fourth switch and a drain coupled to the first switch.

11. A method for manufacturing a test circuit, comprising:
providing a wafer having a die;
providing a first switch, a second switch, a third switch, and a contact pad, wherein the contact pad is connected with a node of the first switch and a node of the second switch;
coupling a drain of a first DUT of a first set of DUTs arranged in a first column and a drain of a second DUT of a second set of DUTs arranged in a second column to the contact pad, wherein there is no switch or DUT connected between the drain of the first DUT and the drain of the second DUT, and wherein there is no switch or DUT connected between any two of the node of the first switch, the node of the second switch, the contact pad, and the drain of the first DUT;
coupling the drain of the first DUT and the drain of the second DUT to a signal receive node through the second switch; and
coupling a source of the first DUT and a source of the second DUT to a second signal supply node through the third switch.

12. The method of claim 11, wherein the contact pad is disposed between the node of the first switch and the first DUT, and the contact pad is closer to the first DUT than to the second DUT.

13. The method of claim 12, further comprising:
coupling gates of the first set of DUTs to a fourth switch configured to turn on or turn off the first set of DUTs; and
coupling gates of the second set of DUTs to a fifth switch configured to turn on or turn off the second set of DUTs.

14. The method of claim 11, wherein the first DUT and the second DUT are arranged in a row.

15. The method of claim 11, wherein the first DUT and a third DUT of the first set of DUTs have different electrical characteristic such that when the first DUT is turned on, the third DUT is turned off, or vice versa.

16. A method for testing a wafer, the wafer including a die, a scribe line adjacent to the die, and a test circuit in the scribe line, the test circuit including:
    a first switch configured to simultaneously couple a first DUT of a first set of DUTs arranged in a first column and a second DUT of a second set of DUTs arranged in a second column to a first signal supply node, a second switch configured to simultaneously couple the first DUT and the second DUT to a signal receive node, and a contact pad connecting with a node of the first switch and a node of the second switch, wherein the first DUT and the second DUT are connected to the first switch and the second switch through the contact pad, wherein there is no switch or DUT connected between a drain of the first DUT and a drain of the second DUT, and wherein there is no switch or DUT connected between any two of the node of the first switch, the node of the second switch, the contact pad, and the drain of the first DUT, the method comprising:
applying a first test signal to the first DUT and the second DUT through the first switch;
switching a logic state of the first DUT;
switching a logic state of the second DUT; and detecting a short circuit via determining electrical conti-
nuity between a drain of the first DUT and a drain of the
second DUT.

17. The method of claim 16, further comprising:
receiving a sensing signal from the first DUT and the
second DUT through the second switch.

18. The method of claim 17, further comprising:
turning on the first DUT and turning off a third DUT of the
first set of DUTs simultaneously through a third switch.

19. The method of claim 18, further comprising:
turning off the first DUT and turning on the third DUT
simultaneously through the third switch; and
applying a second test signal to the third DUT through a
fourth switch.

20. The method of claim 19, further comprising: applying
the second test signal simultaneously to the third DUT and
to a fourth DUT of the second set of DUTs through the
fourth switch.

\* \* \* \* \*